United States Patent [19]

Nakayama et al.

[11] Patent Number: 4,628,338
[45] Date of Patent: Dec. 9, 1986

[54] SEMICONDUCTOR DEVICE

[75] Inventors: Yoshiro Nakayama, Yokohama; Hidetake Suzuki, Tokyo, both of Japan

[73] Assignee: Fujitsu Limited, Kawasaki, Japan

[21] Appl. No.: 779,618

[22] Filed: Sep. 25, 1985

Related U.S. Application Data

[63] Continuation of Ser. No. 437,125, Oct. 28, 1982, abandoned.

[30] Foreign Application Priority Data

Oct. 29, 1981 [JP] Japan ............... 56-174038

[51] Int. Cl.$^4$ .............. H01L 29/48; H01L 29/80
[52] U.S. Cl. .................. 357/15; 357/22; 357/65; 357/67; 357/71
[58] Field of Search .............. 357/22, 15, 65, 67, 357/71

[56] References Cited

U.S. PATENT DOCUMENTS

| 3,877,051 | 4/1975 | Calhoun et al. | 357/71 S |
|---|---|---|---|
| 4,048,646 | 9/1977 | Ogawa et al. | 357/22 |
| 4,263,605 | 4/1981 | Christan et al. | 357/65 |
| 4,300,149 | 11/1981 | Howard et al. | 357/67 S |
| 4,377,030 | 3/1983 | Pettenpaul et al. | 357/15 |

FOREIGN PATENT DOCUMENTS

| 55-125666 | 9/1980 | Japan | 357/71 S |
|---|---|---|---|
| 2024506 | 1/1980 | United Kingdom . | |

OTHER PUBLICATIONS

Murarka, J. Vac. Sci. Tech., 17(4), Jul./Aug. 1980, pp. 775-792.

IBM Technical Disclosure Bulletin, "Silicon Barrier Layer Metallurgy System for Ohmic or SBD Contacts", Alcorn et al., vol. 21, No. 6, Nov. 1978, pp. 2403-2405.

IBM Technical Disclosure Bulletin, "Metal Silicides for Schottky Barrier Diode Applications", Berenbaum et al., vol. 22, No. 10, Mar. 1980, pp. 4521-4522.

Primary Examiner—Martin H. Edlow
Assistant Examiner—Jerome Jackson, Jr.
Attorney, Agent, or Firm—Staas & Halsey

[57] ABSTRACT

A compact connection structure between two electrodes made of two types of metals, i.e., metals which respectively make Schottky and ohmic contact with a semiconductor, is provided by using a high melting point metal or silicide thereof which makes Schottky contact with the semiconductor as one electrode metal. The two types of electrodes can be brought into direct contact with each other, enabling elimination of through hole connections between them and therefore increased semiconductor device density.

16 Claims, 12 Drawing Figures

SEMICONDUCTOR DEVICE

This is a continuation of co-pending application Ser. No. 437,125 filed on Oct. 28, 1982, now abandoned.

BACKGROUND OF THE INVENTION

1. Field of the Invention

The present invention relates to a semiconductor device, more particularly, an electrode connection structure in a semiconductor integrated circuit device.

2. Description of the Prior Art

A semiconductor integrated circuit device, in particular, one comprising a compound semiconductor such as gallium arsenide (GaAs), gallium arsenide/gallium aluminum arsenide (GaAs/GaAlAs), or indium phosphide (InP), often includes two or more types of electrodes of different materials interconnected with each other. For example, a metal semiconductor field effect transister (MES FET) using GaAs has gate electrodes of, e.g., aluminum (Al), which makes Schottky contact with GaAs of an active region, and source and drain electrodes of, e.g., gold-germanium (AuGe), which make ohmic contact with the GaAs of the active region. A GaAs integrated circuit (IC) which is integrated with such MES FET's requires electrical connections between the above two types of electrodes.

FIGS. 1 to 3 show an inverter circuit as an example of such connections. FIG. 1 is a circuit diagram of an inverter circuit, FIG. 2 is a plan view of the patterns for elements of the inverter circuit of FIG. 1, and FIG. 3 is a sectional view taken on the line III—III in FIG. 2. In the inverter circuit, a driver transistor $Tr_1$, a load transistor $Tr_2$, and a next stage driver transistor $Tr_3$ are MES FET's. The gate of the load transistor $Tr_2$ is connected to the source of the load transistor $Tr_2$ as well as the drain of the driver transistor $Tr_1$ and the gate of the next stage driver transistor $Tr_3$. In the inverter circuit, the gate of the driver transistor $Tr_1$ is an inlet terminal (IN). The drain of the load transistor $Tr_2$ is connected to one side of a power source ($V_{DD}$). The source of the driver transistor $Tr_2$ is connected to the other side of the power source or ground ($V_{SS}$).

Referring to FIGS. 2 and 3, in an insulating or semi-insulating GaAs substrate 1, active regions 2a and 2b exist as an N-type or N+-type region on which gate electrodes 3a, 3b and 3c and drain or source electrodes 4a, 4b and 4c are formed. The metal of the gate electrodes 3a, 3b and 3c and the metal of the drain or source electrodes 4a, 4b and 4c are different and make Schottky contact and ohmic contact, respectively, with GaAs. All the electrodes 3a, 3b, 3c, 4a, 4b and 4c are covered with a silicon dioxide (SiO$_2$) layer 5 (not shown in FIG. 2). On the SiO$_2$ layer 5, interconnecting lines 6a and 6b, made of, e.g., titanium-platinum-gold (TiPtAu), are formed connecting the electrodes 4a and 4b through contact windows 7a and 7b, respectively. The $Tr_2$ gate electrode 3b, $Tr_2$ source and $Tr_1$ drain electrode 4c, and $Tr_3$ gate electrode 3c are connected by means of connecting portions 8a and 8b. Three through holes 7c, 9a and 9b are opened in the SiO$_2$ layer 5 above the connecting portions 8a and 8b and the electrode 4c. These connecting portions 8a and 8b and the electrode 4c are connected by interconnecting lines 6c, 10a, and 10b which are made of TiPtAu.

The reason for connecting the gate electrode 3b and the drain or source electrode 4c by means of the interconnecting lines 6c, 10a and 10b is that if the aluminum (Al) of the gate electrode and the gold-germanium (AuGe) of the drain or source electrode are directly connected to each other, the aluminum and the gold would react with each other to form purple plague, an intermetallic compound, lowering the yield and reliability of the semiconductor device. Thus, the gate electrodes 3b and 3c and the drain or source electrode 4c are connected by means of the interconnecting lines 6c, 10a and 10b, and the connections between, on the one hand, the interconnecting lines 6c, 10a and 10b and, on the other hand, the gate electrodes 3b and 3c, and the drain or source electrode 4c are made by means of through holes 7c, 9a and 9b. The connections may easily result in insufficient electrical contact between the interconnecting lines and the electrodes due to the presence of SiO$_2$ residue in the through holes.

Further, connections made by means of through holes 9a and 9b require increased area for formation, since consideration must be given to tolerances in aligning the through holes 9a and 9b with the connecting portions 8a and 8b of the gate electrodes 3b and 3c, respectively, and in aligning the interconnecting lines 10a and 10b with the through holes 9a and 9b, respectively. This increased area for through hole connections lowers the degree of integration of a semiconductor integrated circuit device having the above-described inverter circuit.

Referring to FIGS. 2 and 3, due to considerations of alignment tolerances, the through holes 9a and 9b are formed in a square of 2 um (microns)×2 um and the connecting portions 8a and 8b of the gate electrodes 3b and 3c are formed in a square of 6 um×6 um. The interconnecting lines 10a and 10b are formed so as to include a square of 4 um×4 um near the position of the through holes 9a, 9b. Further, the 2 um distance is taken between the connecting portions 8a and 8b of the gate electrodes 3b and 3c and the active region 2a and between the connecting portions 8a and 8b and the active region 2b. Therefore, a 10 um distance is needed between the active regions 2a and 2b.

The use of, for example, titanium-platinum-gold (TiPtAu) can be considered in place of aluminum as th gate-electrode metal so as to avoid the formation of the above-mentioned purple plague and to avoid the increased area of connection portions by means of interconnecting lines and through holes. The titanium-platinum-gold line as an extending portion of the gate electrodes can be formed directly on the source or drain electrode and make contact between them without the formation of purple plague. The direct connection between the two types of electrodes of different metals enables elimination of the use of the interconnecting lines as well as the connection by means of through holes between the interconnecting lines and the electrodes. Therefore, a decrease in the size necessary for making the connections between the two types of results, that is, the alignment tolerances of the layers at the through holes eliminated.

However, a titanium-platinum-gold electrode which makes Schottky contact with gallium arsenide cannot be formed before an ohmic contact is formed since the heat treatment necessary for making the ohmic contact has an adverse effect on the Schottky contact. Therefore, the titanium-platinum-gold line as mentioned above can be formed on the source or drain electrode only within the boundaries of the source or drain electrode. This reduces the reliability of the contact between them and lowers the yield of the semiconductor device due to possible disconnection at the step appearing at the edge of the source or drain electrode. Further, the titanium-platinum-gold (TiPtAu) gate electrode does not allow source and drain regions to be made using the gate electrode as a mask for ion implantation or diffusion since the gate electrode cannot be made before the ohmic contact for the source and drain electrodes. This requires alignment tolerances of the gate electrode with the source and drain regions, increasing the distance between the source and drain regions. This requirement also appears in the case of, e.g., aluminum gate electrodes (see Naoki Yokoyama's Japanese Patent Application No. 55-189544 filed on Dec. 30, 1980; U.S. patent application Ser. No. 334923 filed on Dec. 28, 1981; and European Patent Application No. 81306151.2 filed on Dec. 24, 1981).

SUMMARY OF THE INVENTION

It is, therefore, an object of the present invention to eliminate the above-described problems.

It is a second object of the invention to provide an electrode structure in which a Schottky contact electrode and an ohmic contact electrode formed on the surface of an active layer can be directly connected to each other.

It is a third object of the invention to simplify the electrode interconnection structure and to increase the degree of integration of a semiconductor integrated circuit device.

The present invention is embodied in a semiconductor layer defining an active region or layer; a first part of an electrode, formed on the active region or layer, includes material selected from the group of high melting point metals and a silicide from the group of high melting point metals and makes Schottky contact with the active region or layer; and a second part of the electrode, formed on the active region or layer, is in contact with the first part of the electrode and is made of a material different from that of the first part of the electrode and makes ohmic contact with the active region or layer.

In accordance with the present invention, high melting point metals which make Schottky contact with a semiconductor active region or layer include titanium tungsten (TiW); and silicides of high melting point metals which make Schottky contact with a semiconductor active region or layer include titanium tungsten silicide (TiWSi) and tungsten silicide (WSi). The Schottky contact made between one of these metals and a semiconductor is not adversely affected by the heat treatment for making an ohmic contact, e.g., a temperature of 400° C. to 450° C. This feature makes it possible to use more types of electrode structures than in the prior art.

The present invention may also be embodied in a semiconductor device comprising: a semiconductor region or layer defining an active region or layer; a first electrode, formed on a first active region or layer, making Schottky contact with the first active region or layer; a first part of a second electrode, formed on a second active region or layer, extending from the first electrode and having the same material as that of the first electrode; and a second part of the second electrode formed on the second active region or layer, contact the first part of the second electrode, having a material different from that of the first electrode and making ohmic contact with the second active region or layer. In this embodiment, the second active region or layer may be the first active region or layer.

The above and other objects, features and advantages of the present invention will be more fully described below with reference to the drawings.

DESCRIPTION OF THE PREFERRED EMBODIMENTS

Figure 1:
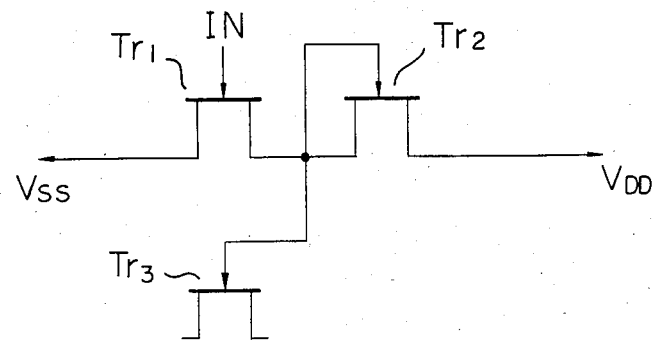
FIG. 1 is a circuit diagram of an inverter circuit.
Figure 2:
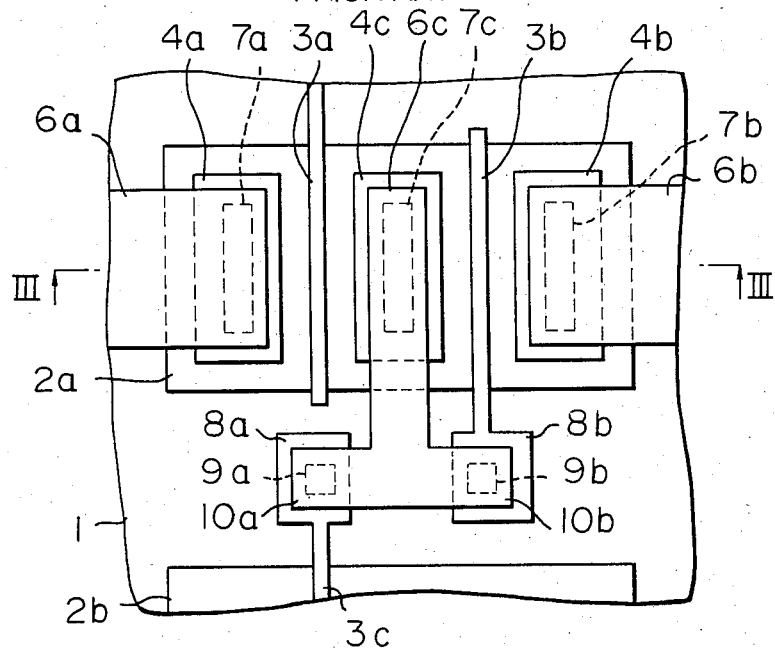
FIG. 2 is a partial plan view of a semiconductor device in the prior art.
Figure 3:
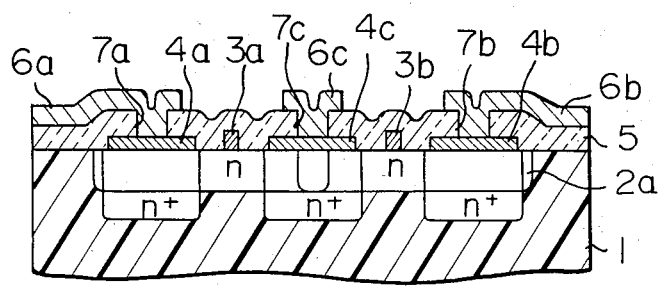
FIG. 3 is a sectional view taken along the line III—III in FIG. 2.
Figure 4:
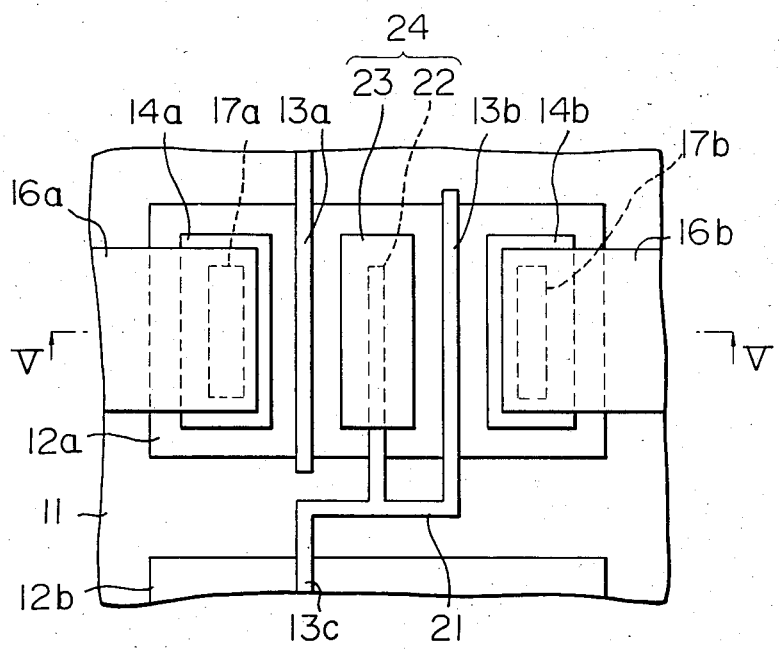
FIG. 4 is a partial plan view of a semiconductor device according to the present invention.
Figure 5:
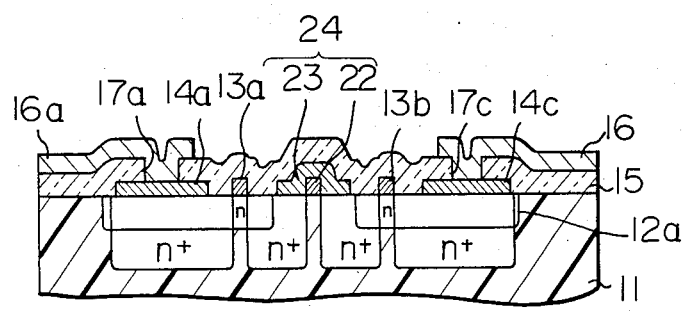
FIG. 5 is a sectional view taken along the line V—V in FIG. 4.

FIGS. 4 and 5 are examples of an inverter circuit according to the present invention and are similar to the inverter circuit of FIGS. 1 to 3. In the example, gate electrodes 13a, 13b and 13c are made of titanium tungsten silicide (TiWSi) which makes Schottky contact with the GaAs of a substrate 11. The gate electrodes 13b and 13c are formed without disconnections between them by extending the gate electrodes 13b and 13c formed on the surfaces of active regions 12a and 12b, respectively, to the surface of the semi-insulating substrate. The extending and connecting portion 21 of the gate electrodes 13b and 13c has a branch line 22 extending to a $Tr_1$-drain-electrode and $Tr_2$-source-electrode-forming portions on the surface of the active region 12a. The gate electrodes 13a, 13b and 13c and their extending portions 21 and 22 can be formed in one step by a lithographic technique. Further, the extending portion 22 of the gate electrode 13b and 13c, formed on the active region 12a, is covered with a gold-germanium (AuGe) alloy layer 23. The alloy makes ohmic contact with the GaAs of the active region 12a. The AuGe layer 23 formed on the surface of the active region 12a surrounds the extending portion 22 and makes ohmic contact with the active region 12a at three sides of the extending portion 22 of the gate electrode 13b and 13c. Thus, the action of the Schottky contact of the extending portion 22, similar to the action of the gates, does not affect the action of the AuGe layer 23 (and therefore the action of the inverter circuit) if the AuGe layer 23 straddles the extending portion 22 of the gate electrode 13b and 13c in the drain-to-source direction and makes ohmic contact with the active region 12a.

The extending portion 22 of the gate electrodes 13b and 13c and the AuGe layer 23 covering the extending portion 22, form an electrode 24 which serves as the source electrode of $Tr_1$ and the drain electrode of $Tr_2$. The drain region of $Tr_1$ and the source region of $Tr_2$ are connected to the gates 13b and 13c of $Tr_2$ and $Tr_3$ through the AuGe layer 23 and the extending portions 22 and 21. The AuGe layer 23 can be formed simultaneously in the step for forming the electrodes 14a and 14b.

Figure 6:
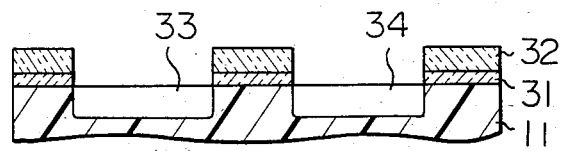
FIGS. 6-12 illustrate a process for fabricating the semiconductor device shown in FIG. 4.

FIGS. 6 to 12 illustrate the steps of fabricating the inverter circuit of FIGS. 4 and 5. The semi-insulating substrate 11 is a chromium (Cr) doped or undoped GaAs substrate having a resistivity of $10^6$ to $10^8$ ohm-cm. On the surface of the GaAs substrate 11, a silicon dioxide (SiO$_2$) layer 31 and a photoresist layer 32 are formed and selectively patterned so as to implant silicon (Si) ions into the substrate 11 by using the patterned layers 31 and 32 as a mask. Dosages of $1 \times 10^{12}$ cm$^{-2}$ and $2 \times 10^{12}$ cm$^{-2}$ and an implantation energy of 59 keV are used for making a region 33 for an enhancement-type channel of Tr$_1$ and a region 34 for an depletion-type channel of Tr$_2$, respectively (FIG. 6). The depth of the implantations is about 1000 Å, but the region 34 is slightly deeper in depth and has a slightly higher impurity concentration than the region 33 due to the difference of their dosages.

Figure 7:
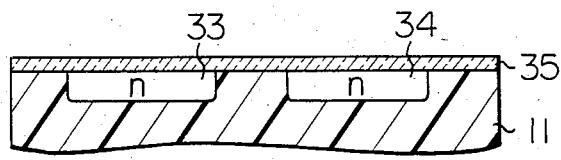

After removing the photoresist and SiO$_2$ layers 31 and 32 and forming an approximately 1000 Å-thick SiO$_2$ 35 layer on the surface of the substrate 11, the silicon (Si) ion implanted regions 33 and 34 are annealed at 850° C. for 10 to 15 minutes in an atmosphere of nitrogen (N$_2$)+10% hydrogen (H$_2$) (FIG. 7).

Figure 8:
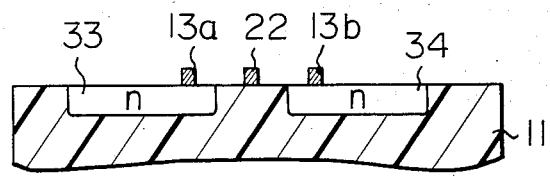
Figure 9:
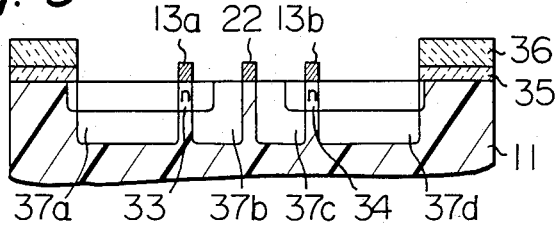

After removing the SiO$_2$ layer 35, an approximately 4500 to 5000 Å-thick TiWSi layer is deposited on the substrate 1 by sputtering. The TiWSi layer is selectively dry etched so as to form gate electrodes 13$a$, 13$b$ and 13$c$ and their extending portions 21 and 22 (13$c$ and 21 are not shown in FIG. 8), the width of the gate electrodes and the extending portion being about 1 um (FIG. 8).

Figure 10:
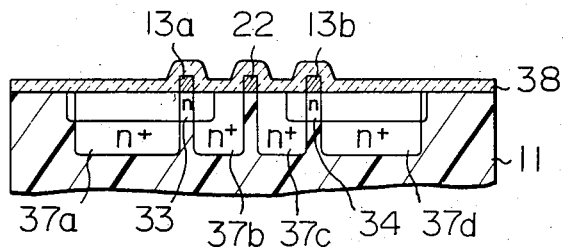

Then, silicon ions are implanted at a dosage of $1.7 \times 10^{13}$ cm$^{-2}$ and at an implantation energy of 175 keV, to form active layers (i.e., a source region 37$a$, a drain region 37$b$ of Tr$_1$, a source region 37$c$, and a drain region 37$d$ of Tr$_2$), by using the patterned SiO$_2$ and photoresist layers 35 and 36, respectively, as well as the gate electrodes 13$a$ and 13$b$ and the extending portion 22 in the opening of the patterned layers 35 and 36 (FIG. 9), as masks. The ion implanted regions are annealed at 800° C. for 5 to 10 minutes in an atmosphere of nitrogen (N$_2$)+10% hydrogen (H$_2$) forming an a SiO$_2$ layer 38 and resulting in a depth of the active layers 37$a$, 37$b$, 37$c$ and 37$d$ of about 3000 Å (FIG. 10).

Figure 11:
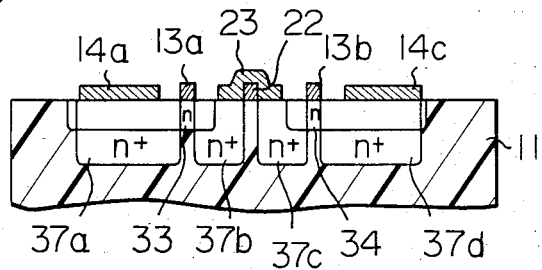
Figure 12:
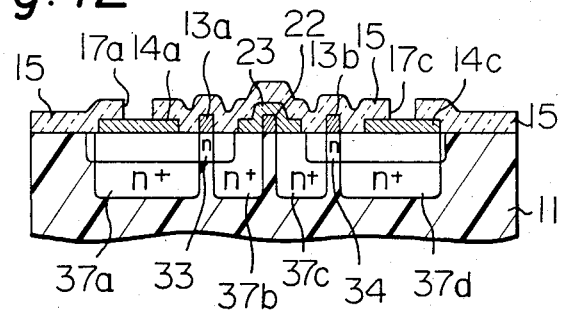

After removing the SiO$_2$ layer 38, ohmic contact electrodes 14$a$, 14$c$, and 23 are formed by selectively depositing an approximately 300 to 350 Å-thick AuGe layer and an approximately 3000 Å-thick gold layer by using a lift-off technique and then annealing at 450° C. for 1 minute to form an alloy of the AuGe of the electrodes 14$a$, 14$c$ and 23 and the GaAs of the substrate (FIG. 11). The electrodes 13$a$, 13$b$, 14$a$, 14$c$ and 23 and the substrate 11 are covered with a SiO$_2$ layer 15 having a thickness of 5000 Å, in which through holes 17$a$ and 17$c$ are opened to form interconnecting lines 16 made of a 500 Å-thick titanium (Ti) layer and a 7000 Å-thick gold layer, thereon (FIG. 12 and FIG. 5).

In the example of the inverter circuit according to the present invention, the width of the electrode 24 (the size in the right-to-left direction in FIG. 4) is about 4 um instead of 6 um, as in the prior art example. Further, the distance between the active regions 12$a$ and 12$b$ is about 6 um since the 2 um distances are needed between the extending portion 21 of the gate electrodes 13$b$ and 13$c$ and the active regions 12$a$ and 12$b$ a 2 um width is needed for the extending portion 21, including the alignment. Furthermore, the distance between the source region 37$a$ or 37$c$ and the drain region 37$b$ or 37$d$, is the same as the width of the gate electrode 13$a$ or 13$b$, respectively, due to the self-alignment of the source and drain regions with the gate electrode using the gate electrode as a mask for forming the source and drain regions by ion implantation or diffusion, resulting in a decrease of that distance, i.e., the length of the gate. Thus, in accordance with the present invention, the semiconductor integrated circuit device having, e.g., the above described inverter circuit has a greater density so the degree of integration of the device is improved.

It should be noted that many other applications of the present invention can be made by those skilled in the art and that the invention is not limited to the above inverter circuit.

We claim:

1. A semiconductor device comprising:
   a semiconductor layer;
   an n-type active area partially surrounding a portion of said semiconductor layer;
   an electrode including:
     a first part, formed on and in contact with said portion of said semiconductor layer partially surrounded by said n-type active area and comprising a material selected from the group consisting of high melting point metals and a silicide of the group of high melting point metals, for making Schottky contact with said semiconductor layer; and
     a second part, formed on and in contact with a portion of said n-type active area and on and in contact with said first part of said electrode, and comprising a material different from said material of said first part of said electrode, for making ohmic contact with said portion of said n-type active area, said first and second parts of said electrode contacting each other over said semiconductor layer, and said entire electrode, comprising said first and second parts, acting as an ohmic electrode for said portion of said n-type active area.

2. A semiconductor device comprising:
   a semiconductor layer;
   an n-type active area formed in a portion of said semiconductor layer and including first and second portions which partially surround a portion of said semiconductor layer in said n-type active area;
   a first electrode, formed on and in contact with said first portion or said n-type active area and comprising a material selected from the group of high melting point metals and a silicide of the group of high melting point metals, making Schottky contact with said first portion of said n-type active area;
   a second electrode including:
     a first part comprising the same material as that of said first electrode, formed on and in contact with said portion of said semiconductor layer partially surrounding said n-type active area and extending from said first electrode; and
     a second part, formed on and in contact with said second portion of said n-type active area and on and in contact with said first part of said second electrode, comprising a material different from that of said first electrode, for making ohmic contact with said second portion of said n-type active area, said first and second parts of said second electrode contacting each other, and said first and second parts of said second electrode acting as an ohmic contact electrode for said second portion of said n-type active area.

3. A semiconductor device according to claim 2, wherein said first and second active regions are formed as a single n-type active region device.

4. A semiconductor device according to claim 1, wherein said semiconductor layer comprises GaAs.

5. A semiconductor device according to claim 4, wherein said first part of said electrode comprises a material selected from the group consisting of titanium and tungsten or a silicide thereof.

6. A semiconductor device according to claim 5, wherein said second part of said electrode comprises AuGe/Au layers.

7. A semiconductor device according to claim 2, wherein said first and second n-type active regions are formed as the same region.

8. A semiconductor device according to claim 2, wherein said semiconductor layer comprises GaAs.

9. A semiconductor device according to claim 2, wherein said first electrode comprises a material selected from the group consisting of titanium and tungsten or a silicide thereof.

10. A semiconductor device according to claim 2, wherein said second part of said second electrode comprises AuGe/Au layers.

11. A semiconductor device according to claim 2, further comprising:
a first FET having a gate electrode formed from said first electrode; and
a second FET having a source or drain electrode formed from said second electrode.

12. A semiconductor device according to claim 2, further comprising a first FET having a gate electrode formed from said first electrode.

13. A semiconductor device according to claim 11, wherein said first FET includes a source and drain electrode and wherein said second electrode is also said source or drain electrode of said first FET.

14. A semiconductor device according to claim 2, further comprising:
a third n-type active region formed in said semiconductor layer; and
a third electrode, comprising the same material as that of said first electrode, formed on and in contact with such third n-type active region and extending from said first electrode and said first part of said second electrode, for making Schottky contact with said third n-type active region.

15. A semiconductor device according to claim 14, further comprising:
a first FET having a gate electrode formed from said first electrode;
a second FET having a source or drain electrode formed from said second electrode; and
a third FET having a gate electrode formed from said third electrode.

16. A semiconductor device according to claim 15, wherein said first FET includes a source and drain electrode and wherein said second electrode is also said source or drain electrode of said first FET.

* * * * *

UNITED STATES PATENT AND TRADEMARK OFFICE
CERTIFICATE OF CORRECTION

PATENT NO. : 4,628,338
DATED : DECEMBER 9, 1986
INVENTOR(S) : YOSHIRO NAKAYAMA ET AL.

It is certified that error appears in the above-identified patent and that said Letters Patent is hereby corrected as shown below:

Col. 2, line 42, "th" should be --the--;
      line 56, after "of" insert --electrodes--;
      line 58, after "holes" insert --are--.

Col. 3, line 57, "comprising" should be --including--;
      line 66, "contact" should be --contacting--.

Col. 5, line 50, after "16" insert --,--;
      line 60, after "12b" insert --and--.

Signed and Sealed this

Thirty-first Day of March, 1987

Attest:

DONALD J. QUIGG

Attesting Officer      Commissioner of Patents and Trademarks